United States Patent
Rivoir

(10) Patent No.: US 7,366,937 B2
(45) Date of Patent: Apr. 29, 2008

(54) FAST SYNCHRONIZATION OF A NUMBER OF DIGITAL CLOCKS

(75) Inventor: Jochen Rivoir, Magstadt (DE)

(73) Assignee: Verigy (Singapore) Pte. Ltd., Palo Alto, CA (US)

( * ) Notice: Subject to any disclaimer, the term of this patent is extended or adjusted under 35 U.S.C. 154(b) by 360 days.

(21) Appl. No.: 11/158,645

(22) Filed: Jun. 22, 2005

(65) Prior Publication Data

US 2005/0289405 A1    Dec. 29, 2005

(30) Foreign Application Priority Data

Jun. 24, 2004    (EP)    .................................. 04102923

(51) Int. Cl.
*H03B 19/00*    (2006.01)
(52) U.S. Cl. ...................... 713/400; 713/401; 713/503; 713/501; 713/502; 713/600; 713/601; 327/116; 327/121; 327/291
(58) Field of Classification Search ...................... None
See application file for complete search history.

(56) References Cited

U.S. PATENT DOCUMENTS

| | | | |
|---|---|---|---|
| 5,406,590 A | | 4/1995 | Culley et al. |
| 5,537,582 A | * | 7/1996 | Draeger ........................ 713/401 |
| 6,351,756 B1 | * | 2/2002 | Taniyoshi ..................... 708/103 |
| 6,463,013 B1 | | 10/2002 | Lai et al. |
| 6,611,159 B1 | | 8/2003 | Retter et al. |
| 6,756,827 B2 | * | 6/2004 | Konuk et al. ................ 327/116 |
| 6,914,459 B2 | * | 7/2005 | Konuk et al. ................ 327/116 |
| 7,158,565 B2 | * | 1/2007 | Tokunaga ..................... 375/229 |

FOREIGN PATENT DOCUMENTS

| | | |
|---|---|---|
| EP | 882991 | 3/1999 |
| EP | 859318 | 7/1999 |
| EP | 864977 | 7/1999 |
| EP | 886214 | 10/1999 |
| EP | 1092983 | 1/2003 |

* cited by examiner

*Primary Examiner*—Abdelmoniem Elamin
(74) *Attorney, Agent, or Firm*—Ohlandt, Greeley, Ruggiero & Perle, L.L.P.

(57) ABSTRACT

The present invention relates to a method for synchronizing a number of digital clocks to a synchronizing signal, said method comprising generating centrally a reference clock, synthesizing said digital clocks from said reference clock using a clock multiplier, respectively, resetting said clock multiplier in response to said synchronizing signal, and masking an output signal of said clock multiplier during settling time of said clock multiplier.

17 Claims, 2 Drawing Sheets

FAST SYNCHRONIZATION OF A NUMBER OF DIGITAL CLOCKS

PRIORITY CLAIM

Foreign priority rights under Title 35, United States Code Section 119, to EPO Application Number 04102923.2, filed Jun. 24, 2004, are hereby claimed.

BACKGROUND

The present invention relates to an improvement of synchronization of a number of digital clocks, in particular for multiple channels in Automated Test Equipment (ATE).

Integrated Circuits (IC) generally need to be tested to assure proper operation. This—in particular—is required during IC development and manufacturing. In the latter case, the ICs are usually tested before final application. During test, the IC, as Device Under Test (DUT), is exposed to various types of stimulus signals, and its responses are measured, processed and usually compared to an expected response of a good device. Automated Test Equipments (ATE) may perform these tasks according to a device-specific test program. Examples for ATE are the Agilent 83000 and 93000 families of Semiconductor Test Systems of Agilent Technologies. Details of those families are also disclosed e.g. in EP-A-859318, EP-A-864977, EP-A-886214, EP-A-882991, EP-A-1092983, U.S. Pat. Nos. 5,499,248, 5,453,995.

Automated Test Equipment (ATE) my be structured using cards comprising electronic circuits, each of the cards controlling electrically a couple of pins of the device under test (DUT) with predetermined signal pattern by test signal processors. A number of cards are arranged in a card cage, respectively, and a number of card cages usually forming the ATE.

A frequency reference can be provided centrally from which one or few synchronized master clocks (MCLK) with typically few 100 MHz can be derived and synchronized centrally and distributed to the cards. A card clock (CCLK) can be selected locally at the card from the few master clocks (MCLK).

Alternatively, a clock can be synthesized on card level using a central frequency reference and synchronizing the card clock to a central synchronization signal (SYNC) feeding direct digital synthesis (DDS) and following phase locked loop (PLL).

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference signs.

DETAILED DESCRIPTION

Figure 1:
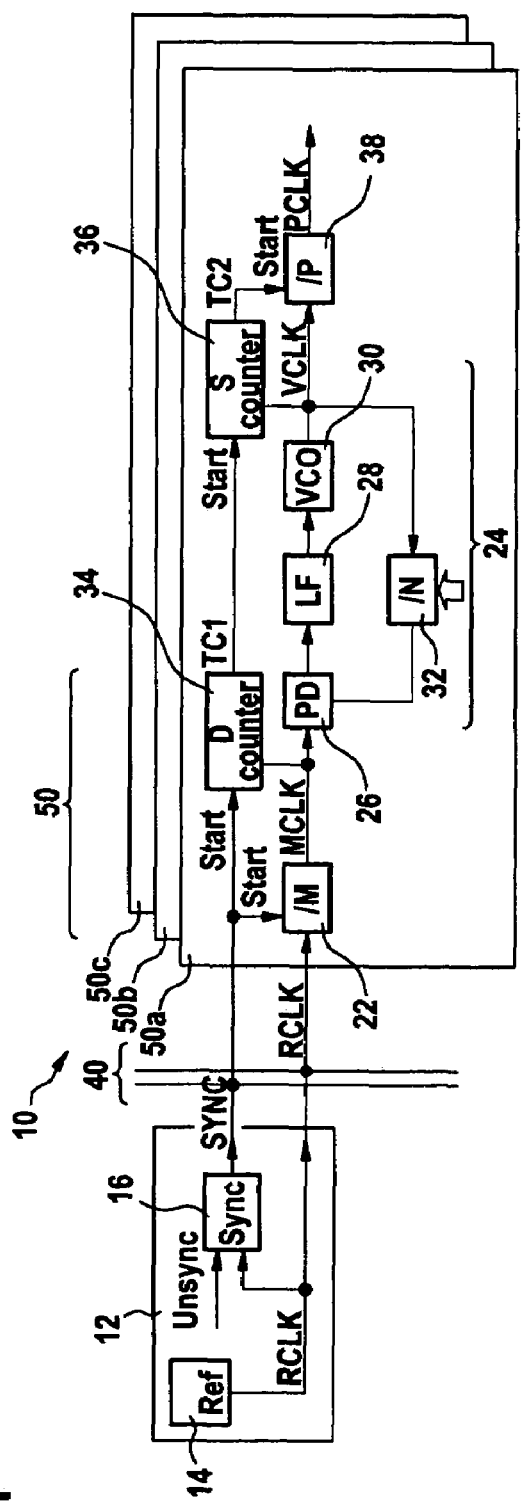
FIG. 1 shows a block diagram of a system for synthesizing digital clock signals.

The invention is operable to provide an improved clock synchronization, including to provide phase and frequency synchronization between channels of the ATE with possibly different frequencies. Testing of electronic devices is improved by using the improved clock synchronization. As one possible result of the present invention, the phase between independent channels of the ATE is repeatable from test to test.

A centrally generated reference frequency or reference clock (RCLK) is distributed to the channel cards as well as a synchronization signal, which may be synchronized centrally to the reference clock. A clock multiplier provided locally on the channel card for multiplying the reference frequency by a predetermined integer or N-fractional ratio is reset locally on the channel card in response to the distributed synchronizing signal. Furthermore, the output of the clock multiplier is masked during its settling time.

As a possible result of the invention, a super-period clock, generated centrally by a N/M division of the RCLK where N and M are integer and N<M and distributed to the channel cards for synchronizing of the pin clocks (PCLK), is not needed. This is in particular advantageous in cases of small differences of the desired pin clocks, since the super-period clock is set to the lowest common multiple of all pin periods that need to be synchronized, and thus for small differences the super-period clock can amount to prohibitive times.

According to an embodiment, repeatable phase synchronization is feasible even for close clock frequencies at low cost, high reliability and even for integration in silicon or other applicable semiconductor material, since the settling time for available clock multiplier is in the range of microseconds and thus small compared with test time.

In accordance with an embodiment the clock multiplier has a Phase Locked Loop (PLL) and furthermore a first (M) divider in series to the PLL which can be reset in response to the synchronizing signal. Accordingly no cumbersome detours are necessary for providing synchronization as known from the prior art including DDS and SCLK. The central resources and infrastructure are minimized and thus synchronization is particularly advantageous for the provision of pin individual clock synthesis.

In certain embodiments the output signal of the first (M) divider, which can be regarded as a master clock (MCLK) signal, or the reference clock (RCLK), is counted by a first (D) counter which is started by the synchronizing signal (SYNC). The first (D) counter providing a first delay time being at least as long as the settling time of the clock multiplying; the first delay time, i.e. the number D of periods of MCLK or RCLK, may be longer than the PLL settling time. The output of the first (D) counter can be used directly for masking the output signal of the clock multiplying, e.g. by controlling a gate for passing the output signal of the clock multiplying. Furthermore, the first (D) counter can emulate super-period clock function, if the first delay time equals super-period time.

The output signal of the Phase Locked Loop (PLL) may be counted by a second (S) counter which is started by the output signal of the first (D) counter. The second (S) counter providing a second delay time for a common synchronization of at least some of the number of digital clocks (PCLK) synthesized by different clock multiplying, by counting remaining time until a common synchronization point is reached.

The output of the second (S) counter can control a gate added in series to the PLL for passing the output signal of the PLL. Furthermore it is possible to add a second (P) divider in series to the PLL for dividing the output of the PLL under control of the second (S) counter, i.e. starting the division of the output of the PLL upon a start signal of the second (S) counter.

In a feedback loop of the PLL a third (N) divider is arranged and thus the output frequency of the PLL is N/M times (without second (P) divider, i.e. P=1) or N/(M×P) times (including a second (P) divider) the frequency of the reference clock RCLK. The values N, M and even P can be programmed according to desired frequency of the pin clock PCLK. All first (M) dividers of all channels for which synchronization is desired may be reset synchronously with SYNC, thus the output signals of all corresponding first (M) divider having predictable phase to SYNC.

For an integer N of the third (N) divider in the feedback loop of the PLL, i.e. N being constant and not fractional-N, the input of the third (N) divider is also aligned, i.e. there is an edge in the input signal for every edge in the output signal of the third (N) divider means. Therefore, the third (N) divider may be, but needs not to be reset by the synchronization signal SYNC.

If repeatable phase is required, N of the third (N) divider has to be constant during PLL settling time; afterwards, i.e. during supplemental settling time, N can be varied dynamically, e.g. for providing phase modulation.

If a repeatable phase is not required, the output of the first (D) counter can asynchronously start the second (S) counter, yet taking usual care of possible meta-stability.

A reference frequency and thus a reference clock (RCLK) may be generated centrally and distributed to the cards, i.e. to electronic circuits comprising test signal processors, each of which controlling electrically a pin of the DUT. Each test signal processor may control one single pin of the DUT, respectively. A pin-individual clock (PCLK) is synthesized and clock modulation under pin control is possible, including frequency, phase and/or amplitude modulation of the PCLK.

The present invention also relates to a software program or product for executing the method for synchronizing digital clock signals when running on a date processing system such as a computer. The program or product is stored on a data carrier. Furthermore, the present invention relates to a system for synchronizing digital clock signals according to the present invention.

FIG. 1 shows a block diagram of a system 10 for synthesizing digital clock signals PCLK for an electronic device under test DUT (not shown). The system 10 comprises a central clock generator 12, clock distribution lines 40 distributing the centrally generated reference clock signal RCLK and a synchronization signal SYNC to a number of cards 50a to 50c, which are arranged in one card cage 50 of a number of card cages, only one of which is shown in FIG. 1. Each card 50a to 50c can comprise a number of test processors, only one of which is shown in FIG. 1. Each test processor controls one pin of the DUT, i.e. stimulating the corresponding pin and detecting the electrical response on the stimulus.

The central clock generator 12 may be provided centrally for the system 10 and comprises a reference frequency generator 14 generating a reference clock RCLK which is distributed by distribution lines 40 to all test processors of all cards 50a to 50c of the card cage 50, to all test processors of all card cages of the system 10, or at least to those which are synthesizing PCLK that need to be synchronized. An originally unsynchronized synchronizing signal Unsync is synchronized as SYNC using the RCLK by synchronizer 16.

RCLK is inputted in a first (M) divider 22 and thus divided by M, i.e. the clock period of RCLK is multiplied by M, resulting in a master clock MCLK. The first (M) divider 22 is reset by the synchronizing signal SYNC. All first (M) divider 22 of all test processors which pin clocks PCLK have to be synchronized are reset synchronously with the synchronizing signal SYNC, so that the output signals of the first (M) divider 22, namely the master clocks MCLK, have predictable phase to the synchronizing signal SYNC.

The master clock MCLK is inputted in a PLL 24 comprising a phase detector PD 26, a low pass filter LF or integrator 28, a voltage-controlled oscillator VCO 30 and a feed back loop comprising a third (N) divider 32. The output clock VCLK of PLL 24 has a N/M×RCLK clock frequency being phase synchronized to RCLK. First (M) divider 22 and third (N) divider 32 are programmed according to the desired clock frequency VCLK.

During settling time 40, the PLL 24 produces an unpredictable output signal, i.e. with unpredictable frequency and phase. Therefore, the output signal of PLL 24 is masked, i.e. no output signal is provided as pin clock PCLK as long as frequency and phase are not aligned to reference clock RCLK. After settling time 40, the PLL 24 drives phase difference at phase detector PD 26 to zero. The loop filter of the PLL 24 is of type two, i.e. comprises integrator function by low pass filter LF 28. Thus the phase of the output of the third (N) divider 32 is aligned with master clock MCLK and thus with reference clock RCLK. For an integer N being constant and not fractional-N, the input of third (N) divider 32 is also phase aligned with master clock MCLK, i.e. there is an edge in the input signal for every edge in the output signal of third (N) divider 32.

The synchronizing signal SYNC starts a first (D) counter 34 counting the pulses of the master clock MCLK and that outputs as output signal $TC_1$ a pulse after a number of D pulses of the master clock MCLK. The delay produced by the first (D) counter 34 is longer than the settling time of the PLL 24.

The output signal $TC_1$ of the first (D) counter 34 starts a second (S) counter 36 counting the pulses of the output signal VCLK of the PLL 24, i.e. second (S) counter 36 outputs as output signal $TC_2$ a pulse after a number of S pulses of the output VCLK of the PLL 24.

The output signal $TC_2$ of the second (S) counter 36 starts a second (P) dividing 38 that outputs a pulse every P-th pulse of the output VCLK of the PLL 24 resulting in the pin clock PCLK. For P=1 the second (P) dividing 38 represents a gate passing the output signal VCLK of the PLL 24 as pin clock PCLK. The delay produced by the optional second (S) counter 34 delays the output signal VCLK of the PLL 24 for a remaining time until a synchronization point is reached which is a common synchronization point for all test processors and thus for all pin clocks PCLK that have to be synchronized.

Figure 2:
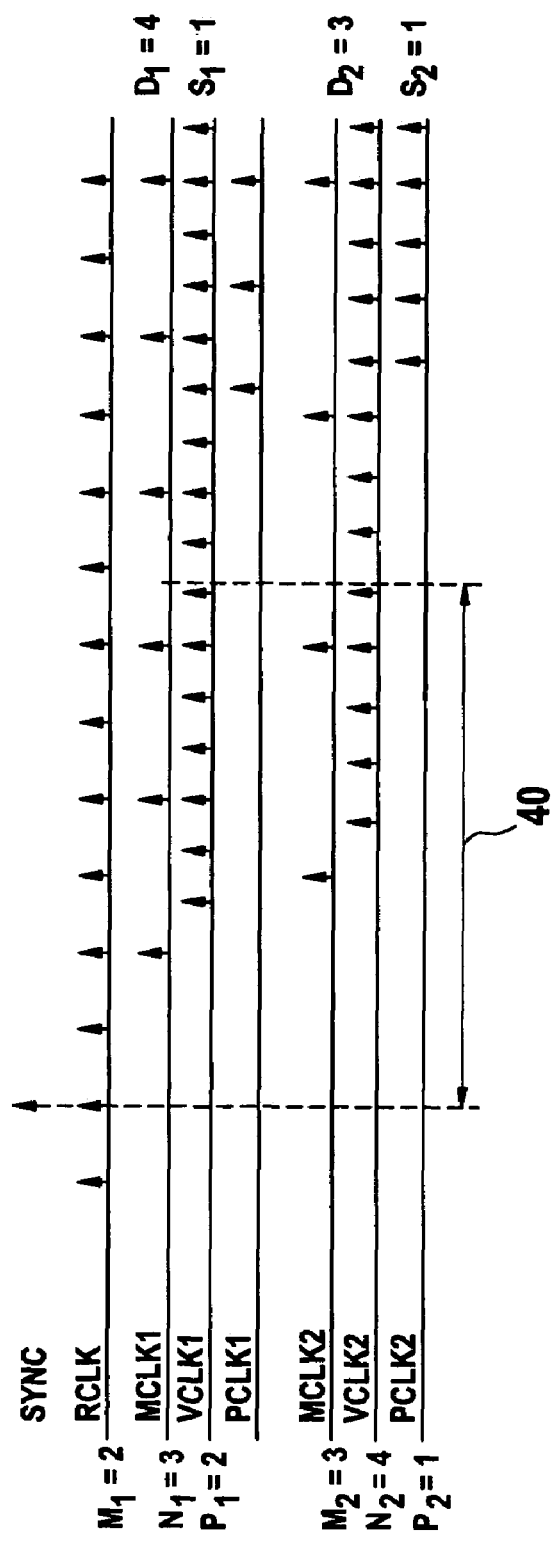
FIG. 2 shows two pulse diagrams corresponding to the system 10 shown in FIG. 1.

FIG. 2 shows two pulse diagrams corresponding to the system 10 shown in FIG. 1. The upper pulse diagram shows the pulse signals for a first test processor with $M_1=2$, $N_1=3$, $D_1=4$, $S_1=1$, and $P_1=2$, thus realizing a clock frequency $f_{PCLK}$ of the pin clock PCLK being $$f_{PCLK,1}=N_1/(M_1 \times P_1) \times f_{RCLK} = 3/4 \times f_{RCLK}.$$

The lower pulse diagram shows the pulse signals for a second test processor with $M_2=3$, $N_2=4$, $D_2=3$, $S_2=1$, and $P_2=1$, thus realizing a clock frequency $f_{PCLK}$ of the pin clock PCLK being $$f_{PCLK,2}=N_2/(M_2 \times P_2) \times f_{RCLK} = 4/3 \times f_{RCLK}.$$

Both clock frequencies $f_{PCLK,1}$ and $f_{PCLK,2}$ being phase aligned to the reference clock RCLK and already the first pulses of the respective pin clocks $PCLK_1$ and $PCLK_2$ are phase aligned to the reference clock RCLK.

Figure 3:
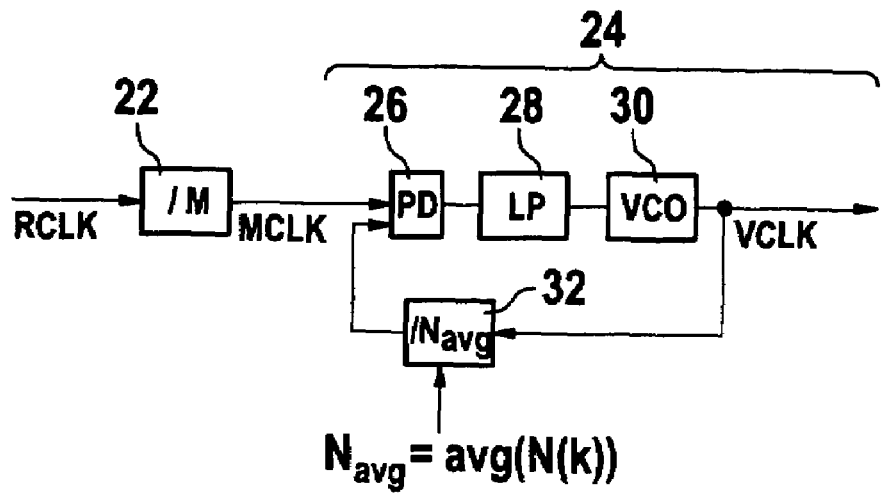
FIG. 3 shows a block diagram for a possible fractional-N PLL.

FIG. 3 shows a block diagram for a possible fractional-N PLL 24. The reference clock RCLK is divided by M using the first (M) dividing 22 as described above. The output signal VCLK of the PLL 24 having a frequency $f_{VCLK}$ of $$f_{VCLK} = N_{avg}/M \times f_{RCLK}$$

with adjustable divisor $N_{avg}$ being defined as $N_{avg}$=average of a sequence N(k) of values N. The quotient $N_{avg}/M$ can be adjusted very fine and particularly fractional of N can be adjusted depending on the values of the sequence N(k).

Figure 4:
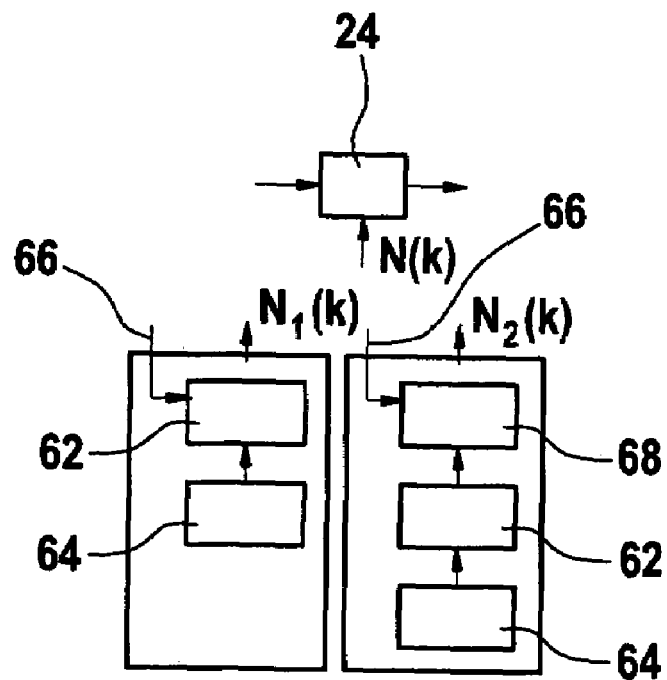
FIG. 4 shows two possible embodiments for providing a sequence N(k).

FIG. 4 shows two possible embodiments for providing a sequence N(k) of values N for the third (N) divider 32 and thus for the PLL 24 shown in FIG. 3. The sequence $N_1(k)$ can be provided directly by a data sequencer 62 receiving data from a pattern memory 64 and being controlled by control line 66 of a central workstation or a local processor. Alternatively, the sequence $N_2(k)$ can be provided by dedicated hardware, e.g. a delta-sigma modulator (DSM) 68, which can be realized in hardware or software.

Only as an example for modifications and/or variations of the present invention it is noted that PLL 24 can also be based on a LC-oscillator or a ring-oscillator. The pin clock PCLK can be synthesized with N/M PLL, fractional-N PLL, or noise-shaped fractional-N PLL. The RCLK signal can be fix or adjusted application dependent, whereas RCLK can be very low, e.g. in the range of 10 MHz, medium in the range of 100 MHz, or high in the range of 1 GHz or above.

What is claimed is:

1. A method for synchronizing a plurality of digital clocks to a synchronizing signal, said method comprising:
   generating centrally a reference clock;
   synthesizing, from said reference clock using a first clock multiplier, a first digital clock, wherein said first clock multiplier includes:
      (a) a phase locked loop having a divider that is programmable to provide a first divider ratio so that said first digital clock has a first frequency, wherein said first clock multiplier has a first settling time, and
      (b) a first masking circuit that, in response to said synchronizing signal, generates a first time delay signal that masks an output of said first clock multiplier for a period of time that is at least as long as said first settling time;
   synthesizing, from said reference clock using a second clock multiplier, a second digital clock, wherein said second clock multiplier includes:
      (a) a phase locked loop having a divider that is programmable to provide a second divider ratio so that said second digital clock has a second frequency, wherein said second clock multiplier has a second settling time, and
      (b) a second masking circuit that, in response to said synchronizing signal, generates a second time delay signal that masks an output of said second clock multiplier for a period of time that is at least as long as said second settling time; and
   in response to a receipt of said synchronizing signal:
      (i) resetting said first and second clock multipliers; and
      (ii) generating said first and second time delay signals, thus masking said output of said first clock multiplier during said first settling time, and masking said output of said second clock multiplier during said second settling time.

2. The method of claim 1, further comprising synchronizing said synchronizing signal to said reference clock.

3. The method of claim 2, wherein said synchronizing signal is synchronized centrally to said reference clock, and said synchronizing signal and said reference clock are distributed to a plurality of electronic circuits synthesizing one of said plurality of digital clocks, respectively.

4. The method of claim 1, wherein said first clock multiplier further comprises an additional divider coupled in series to said phase locked loop of said first clock multiplier.

5. The method of claim 4, wherein said additional divider is reset in response to said synchronizing signal.

6. The method of claim 4, further comprising counting, by a first counter, in response to said synchronizing signal, an output signal of said first divider, or said reference clock, wherein said first counter provides said first time delay.

7. The method of claim 6, further comprising counting, by a second counter, an output of said phase locked loop of said first clock multiplier, wherein said second counter starts counting in response to an output signal of said first counter, said second counter providing a delay time for a common synchronization of at least some of said plurality of digital clocks.

8. The method of claim 5, further comprising counting, by a first counter, in response to said synchronizing signal an output signal of said first divider, or said reference clock, wherein said first counter provides said first delay time.

9. The method of claim 8, further comprising counting, by a second counter, an output of said phase locked loop of said first clock multiplier, wherein said second counter starts counting in response to an output signal of said first counter, said second counter providing a delay time for a common synchronization of at least some of said plurality of digital clocks.

10. A storage medium having a program encoded thereon that is executable in a processor to perform a method that includes:
   generating centrally a reference clock;
   synthesizing, from said reference clock using a first clock multiplier, a first digital clock, wherein said first clock multiplier includes:
      (a) a phase locked loop having a divider that is programmable to provide a first divider ratio so that said first digital clock has a first frequency, wherein said first clock multiplier has a first settling time, and
      (b) a first masking module that, in response to said synchronizing signal, generates a first time delay signal that masks an output of said first clock multiplier for a period of time that is at least as long as said first settling time;
   synthesizing, from said reference clock using a second clock multiplier, a second digital clock, wherein said second clock multiplier includes:
      (a) a phase locked loop having a divider that is programmable to provide a second divider ratio so that said second digital clock has a second frequency, wherein said second clock multiplier has a second settling time, and
      (b) a second masking module that, in response to said synchronizing signal, generates a second time delay signal that masks an output of said second clock multiplier for a period of time that is at least as long as said second settling time; and in response to a receipt of said synchronizing signal:
  (i) resetting said first and second clock multipliers; and
  (ii) generating said first and second time delay signals, thus masking said output of said first clock multiplier during said first settling time, and masking said output of said second clock multiplier during said second settling time.

11. A system for synchronizing a number of digital clocks to a synchronizing signal, said system comprising:
  a generator that generates centrally a reference clock;
  a first synthesizer that synthesizes a first digital clock from said reference clock using a first clock multiplier, wherein said first clock multiplier includes:
    (a) a phase locked loop having a divider that is programmable to provide a first divider ratio so that said first digital clock has a first frequency, wherein said first clock multiplier has a first settling time, and
    (b) a first masking circuit that, in response to said synchronizing signal, generates a first time delay signal that masks an output of said first clock multiplier for a period of time that is at least as long as said first settling time;
  a second synthesizer that synthesizes a second digital clock from said reference clock using a second clock multiplier, wherein said second clock multiplier includes:
    (a) a phase locked loop having a divider that is programmable to provide a second divider ratio so that said second digital clock has a second frequency, wherein said second clock multiplier has a second settling time, and
    (b) a second masking circuit that, in response to said synchronizing signal, generates a second time delay signal that masks an output of said second clock multiplier for a period of time that is at least as long as said second settling time; and
  wherein said first clock multiplier, in response to a receipt of said synchronizing signal:
    (i) resets said first clock multiplier; and
    (ii) generates said first time delay signal, thus masking said output of said first clock multiplier during said first settling time, and
  wherein said second clock multiplier, in response to a receipt of said synchronizing signal:
    (i) resets said second clock multiplier; and
    (ii) generates said second time delay signal, thus masking said output of said second clock multiplier during said second settling time.

12. The method of claim 1, further comprising keeping said first divider ratio constant while said first time delay signal is active.

13. The method of claim 12, further comprising dynamically varying said first divider ratio, after said first time delay signal goes inactive.

14. The storage medium of claim 10, wherein said method further includes keeping said first divider ratio constant while said first time delay signal is active.

15. The storage medium of claim 14, wherein said method further includes dynamically varying said first divider ratio, after said first time delay signal goes inactive.

16. The system of claim 11, wherein said system keeps said first divider ratio constant while said first time delay signal is active.

17. The system of claim 16, wherein said system dynamically varies said first divider ratio, after said first time delay signal goes inactive.

* * * * *